United States Patent [19]

Newland et al.

[11] 4,264,709
[45] Apr. 28, 1981

[54] SYNERGISTIC PHOTOINITIATORS FOR ULTRAVIOLET CURABLE RESINS

[75] Inventors: Gordon C. Newland; James G. Pacifici, both of Kingsport, Tenn.

[73] Assignee: Eastman Kodak Company, Rochester, N.Y.

[21] Appl. No.: 4,520

[22] Filed: Jan. 18, 1979

Related U.S. Application Data

[63] Continuation-in-part of Ser. No. 820,961, Aug. 1, 1977, abandoned.

[51] Int. Cl.$^3$ .............................................. G03C 1/68
[52] U.S. Cl. ............................... 430/281; 204/159.18; 204/159.23; 430/284; 430/285; 430/286; 430/916; 430/919; 430/920; 430/925

[58] Field of Search ................. 96/115 R, 115 P; 204/159.18, 159.23; 430/281, 284, 285, 286, 916, 920, 919, 925

[56] References Cited

U.S. PATENT DOCUMENTS

| | | |
|---|---|---|
| 3,692,560 | 9/1972 | Rosenkranz et al. .............. 96/115 R |
| 3,878,075 | 4/1975 | McGinniss ......................... 96/115 P |
| 3,912,606 | 10/1975 | Pacifici et al. .................. 204/159.23 |
| 3,988,228 | 10/1976 | Newland et al. .................... 96/115 P |
| 4,012,302 | 3/1977 | Wang et al. ........................ 96/115 P |

*Primary Examiner*—Jack P. Brammer
*Attorney, Agent, or Firm*—J. Frederick Thomsen; Daniel B. Reece, III

[57] ABSTRACT

This invention relates to a series of photoinitiator combinations comprising mixtures of a primary photoinitiator in combination with N-halosuccinimides, N-haloacetanilides and N-halobenzanilides and photopolymerizable composition containing such combinations.

5 Claims, No Drawings

SYNERGISTIC PHOTOINITIATORS FOR ULTRAVIOLET CURABLE RESINS

This application is a continuation-in-part of our application Ser. No. 820,961 filed Aug. 1, 1977, now abandoned.

This invention relates to combinations of additives which are useful in initiating the photocuring of resins and to ethylenically unsaturated compositions containing such combinations. The addition of a photoinitiator to an ethylenically unsaturated monomer or oligomer to produce compositions curable with ultraviolet light is well known. Additionally, it is known that certain specific combinations of different known photoinitiators can be under certain conditions, synergistic in their action as a photoinitiator. See, for example, U.S. Pat. Nos. 3,814,607; 3,673,140; 3,326,710; 3,847,771; 3,427,161; and 3,915,824.

The use of photoinitiators in compositions curable with ultraviolet light is finding wide acceptance in the trade as a low energy, rapid, nonpolluting method of coating materials such as paper and metal canstock. Of particular interest are inks which are dried by irradiation with ultraviolet light. The coatings and inks are usually applied to a web at high speed. It follows, therefore, that a high speed curing system is highly desirable. This is particularly important in ink systems were multicolor inks are applied in coats.

The present invention comprises the novel combination of one or more primary photoinitiators and a halogen compound selected from N-chlorosuccinimide, N-bromosuccinimide, N-chloroacetanilide and N-chlorobenzanilide or mixtures thereof. The weight ratio of the primary photoinitiator to the halogen compound can be varied considerably but generally is within the range of about 1:20 to about 10:1. A second embodiment of our invention is a composition comprising an ethylenically unsaturated material susceptible to photopolymerization and a photoinitiating effective amount of the above-described novel combination of compounds.

We have discovered that the above-mentioned halogen compounds are capable of initiating or promoting the photopolymerization of certain materials susceptible to photopolymerization but that their photoinitiating activity is not sufficient to make their use alone feasible. However, when combined with a primary or known photoinitiator, the photoinitiator activity of the combination exceeds significantly what would have been predicted from the activity of the individual components. Thus, the novel combination can be considered to be synergistic although the use of the halogen compounds as photoinitiators has not been reported previously.

The primary photosensitizers useful in the practice of this invention are well known in the art and are disclosed in various publications and patents such as U.S. Pat. Nos. 3,686,084, 3,728,377, 3,912,606, 3,962,055, 3,962,056, 3,988,228, 4,012,302, the previously mentioned patents, as well as U.S. Pat. Nos. 3,692,560, and 3,878,065; all incorporated herein by reference. These primary photoinitiators are generally benzoin ethers, halomethyl ketones or aromatic ketones in combination with amines. Examples of the primary photoinitiators include benzophenone, 1-chloromethylnaphthalene, 2-chloromethylnaphthalene, 2-chlorothioxanthone, α,α-diethoxyacetophenone, 2,3-dichloronaphthoquinone, 4,4'-bis(α-chloroacetyl)benzene, α,α,α-trichloroacetophenone, isopropyl benzoin ether, 4'-tertbutyl-α,α,α-trichloroacetophenone, 4,4'-bis(chloromethyl)benzophenone, 4-chloromethyl-4'-carbomethoxybenzophenone, 2-chloromethylbenzimidazole, 2-(α-chlorotolyl)benzoxazole, 4,4'-dimethylbenzophenone, 3,4-bis(chloromethyl)benzophenone.

The amount of the combination of primary photoinitiator and halogen compound in our novel photopolymerizable compositions can be varied over a wide range depending on a number of factors such as the curing rate desired, the unsaturated materials used, the particular primary photoinitiator that is present and the presence of other additives such as pigments. We have found that the use of at least one weight percent of the primary photoinitiator and at least one weight percent of the halogen compound, based on the total weight of the composition, generally gives acceptable results. As is known in the art, after a certain concentration is reached, the use of higher concentrations of photoinitiators does not enhance significantly the rate or degree of photopolymerization. Thus the range of the concentration of the primary photoinitiator preferably is about 1–5 weight percent and the concentration of the halogen compound preferably is about 1–10 weight percent.

The ethylenically unsaturated materials useful in this invention can be, for example, lower alkyl and substituted alkyl esters of acrylic and methacrylic acid. Examples of such esters include: methyl methacrylate, ethyl methacrylate, 2-ethylhexyl methacrylate, isobutyl methacrylate, butyl acrylate, 2-hydroxypropyl acrylate, 2-methoxyethyl acrylate, and the like. Polyacrylyl compounds covered in the scope of the invention can be represented by the general formula:

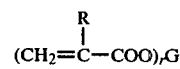

wherein R is hydrogen or methyl; G is a polyvalent alkylene group of the formula $C_xH_{2x-y}$ in which x is 2 to 10 and y is 0 to 2 [e.g., (a) divalent alkylene such as $C_xH_{2x}$ when y=0, i.e., —$C_2H_4$—, $C_3H_6$—, neo-$C_5H_{10}$, and the like; (b) trivalent alkylene such as $C_xH_{2x-1}$ when y=1, i.e.,

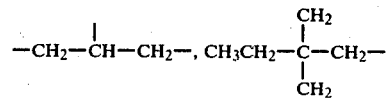

and the like; or (c) tetravalent alkylene such as $C_xH_{2x-2}$ when y=2; e.g.,

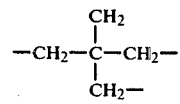

and the like]; a divalent $(C_r-H_{2r}O)_tC_rH_{2r}$— group in which t is 1 to 10 [e.g., oxyethylene, oxypropylene, poly(oxyethylene), poly(oxybutylene), —$CH_2C(CH_3)_2COOCH_2$—C($CH_3$)$_2CH_2$—, etc.]; and r is the valence of G and can be from 2 to 4. Allyl acrylates and methacrylates, diallyl phthalate, vinyl acetate, vinylidene halides, amides such as acrylamide, diacetone acrylamide, vinyl aromatics such as styrene, alkyl styrenes, halostyrenes, and divinylbenzene may also be used.

The above unsaturated materials can be used alone or as mixtures of such compounds or as mixtures in combination with other unsaturated components such as oligomers or unsaturated polyesters, polyurethanes, or substituted cellulose esters. The cellulose esters may be represented by the general formula

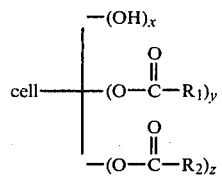

where cell- represents anhydroglucose repeat units and $R_1$ is lower alkyl or aryl and $R_2$ is alkylene, arylene or substituted arylene. X, Y and Z represent the degree of substitution of the anhydroglucose unit and the sum of $X+Y+Z=3$. Z can be from 0.01 to 2.0; however, the preferred range is 0.1 to 1.0.

Oligomers or low molecular weight polymers of saturated moieties may also be incorporated in the systems described above. The ultraviolet-sensitized photopolymerizable compositions may also contain other additives, pigments, colorants, stabilizers, and the like.

The invention will be further illustrated by the following examples, although it will be understood that these examples are included merely for purposes of illustration and are not intended to limit the scope of the invention.

EXAMPLE 1

The photoinitiators to be tested were added to a dope of 36.5% cellulose propionate crotonate in 2-hydroxyethyl acrylate. The sensitized compositions were coated at a thickness of 4 mils onto a glass plate and exposed in 0.1 minute increments to a Gates 420 U11B mercury lamp having an intensity of 80 watts per inch. The exposure period required to cure the coating to a tack-free state was determined and defined as the tack-free cure time. The results of these tests are shown in Table 1.

TABLE 1

| Reactivity of Mixtures in Curing 36.5% CPC[a] in Hydroxyethyl Acrylate | | | |
|---|---|---|---|
| Photoinitiator I | Concn. I, % | Concn. NCS[b] % | Tack-Free Cure Time, Min. |
| None | 0 | 0 | >10.0 |
| None | — | 0.5 | 4.0 |
| 4,4'-Bis(chloromethyl)-benzophenone | 0.5 | 0 | 1.3 |
| 4,4'-Bis(chloromethyl)-benzophenone | 0.5 | 0.5 | 0.8 |
| 4-Chloromethyl-4'-carbomethoxybenzophenone | 0.5 | 0 | 1.2 |
| 4-Chloromethyl-4'-carbomethoxybenzophenone | 0.5 | 0.5 | 1.0 |
| 2-Chlorothioxanthone | 0.5 | 0 | 1.2 |
| 2-Chlorothioxanthone | 0.5 | 0.5 | 0.8 |
| 1-Chloromethylnaphthalene | 0.5 | 0 | 2.6 |
| 1-Chloromethylnaphthalene | 0.5 | 0.5 | 2.1 |

[a]Cellulose propionate crotonate
[b]N-chlorosuccinimide

EXAMPLE 2

The photoinitiators to be evaluated were added to the ethylenically unsaturated composition of Example 1. Files (4 mils thick) were coated onto a glass plate and the tack-free cure time determined as in Example 1. The cured films, in the tack-free state, were extracted with dichloromethane for two hours and the percent extractable material determined. The data, summarized in Table 2, indicate that the mixtures, which were cured for a shorter period than the single component composition, were cured equally well or better than the single component compositions. The significance of this data is the demonstration of the practical benefit of increased cure rate without affecting the degree of curing and in some instances, increasing the degree of cure.

TABLE 2

| Relation of Tack-Free Cure Time With Degree of Cure | | | | |
|---|---|---|---|---|
| | Photoinitiator I at 0.5% | | Photoinitiator with 0.5% NCS[a] | |
| Photoinitiator I | Cure Time, Min. | % Extractable | Cure Time, Min. | % Extractable |
| 2-(α-Chlorotolyl)benzoxazole | 1.3 | 21.6 | 0.6 | 24.3 |
| 2-Chlorothioxanthone | 1.2 | 15.8 | 1.1 | 17.6 |
| 2,3-Dichloronaphthoquinone | 3.1 | 25.2 | 2.2 | 15.7 |
| 1-Chloromethylnaphthalene | 1.2 | 18.0 | 0.7 | 18.6 |

[a]N-chlorosuccinimide

EXAMPLE 3

Several compositions were formulated as with the ethylenically unsaturated composition of Example 1 wherein the concentration of the primary photoinitiator was varied from 0.1 to 2% (W/W). Tack-free cure times were determined using the Gates 420 U11B mercury lamp (80/watts per inch) of Example 1. The data, summarized in Table 3, indicate that N-chlorosuccinimide is synergistic with 4,4'-bis(chloromethyl)benzophenone in all proportions.

TABLE 3

| Effect of Primary Photoinitiator Concentration on Curing Time | | |
|---|---|---|
| Concn. 4,4'-Bis(chloromethyl)benzophenone | Concn. NCS[a] | Tack-Free Cure Time, Min. |
| None | 2 | 2.5 |
| 2 | 0 | 0.3 |
| 0.6 | 0 | 0.65 |
| 0.4 | 0 | 0.75 |
| 0.2 | 0 | 0.83 |
| 0.1 | 0 | 1.3 |
| 1.0 | 1 | 0.4 |
| 0.6 | 2 | 0.4 |
| 0.4 | 2 | 0.5 |
| 0.2 | 2 | 0.65 |
| 0.1 | 2 | 0.6 |

[a]N-chlorosuccinimide

EXAMPLE 4

The photoinitiator mixtures to be evaluated were added to the ethylenically unsaturated composition of Example 1. Coatings (4 mils thick) on glass were cured tack-free with the Gates 420 U11B lamp as described above. The compositions tested and the test results are summarized in Table 4. These data illustrate the effectiveness of mixtures of N-chlorosuccinimide and a wide variety of primary photoinitiators.

TABLE 4

Effectiveness of N-Chlorosuccinimide

| Photoinitiator I at 2% | Tack-Free Cure Time, Min. | |
|---|---|---|
| | Photoinitiator I Alone | With 2% NCS[a] |
| None | — | 2.5 |
| α,α,α-Trichloroacetophenone | 0.82 | 0.5 |
| 2,3-Dichloronaphthoquinone | 3.0 | 1.2 |
| Isopropyl benzoin ether | 1.4 | 1.2 |
| 60,α-Diethoxyacetophenone | 0.62 | 0.50 |
| 2-Chlorothioxanthone | 0.80 | 0.50 |
| Benzophenone | 3.0 | 1.6 |

[a] N-chlorosuccinimide

EXAMPLE 5

The photoinitiator mixtures to be evaluated were mixed with a composition comprising:
13.3% cellulose propionate crotonate
60.0% hydroxypropyl acrylate
6.7% diethylene glycol diacrylate
6.7% benzyl acrylate
13.3% diethylene glycol diacrylate Coatings on glass were cured with a Gates 420 U11B mercury lamp and the tack-free cure times determined. The results of the tests, shown in Table 5, indicate that N-bromosuccinimide is also synergistic with the listed primary photoinitiators and the synergistic mixtures are effective in a wide variety of acrylic esters.

TABLE 5

Effectiveness of N-Bromosuccinimide

| Photoinitiator I | Tack-Free Cure Time, Min. | |
|---|---|---|
| | Photoinitiator I, 2% | NBS[a], 2% |
| None | 4.8 | — |
| None | — | 3.0 |
| 2-(α-Chlorotolyl)benzoxazole | 2.0 | 1.0 |
| 4,4'-Bis(chloromethyl)benzophenone | 1.0 | 0.8 |
| 4-Chloromethyl-4'-carbomethoxybenzophenone | 1.0 | 0.9 |
| 4'-tert-Butyl-α,α,α-trichloroacetophenone | 1.0 | 0.9 |
| Benzophenone | 2.4 | 1.5 |
| 2-Chloromethylbenzimidazole | 1.4 | 0.9 |

[a] N-bromosuccinimide

EXAMPLE 6

The photoinitiator mixtures to be evaluated were mixed with Hetron 520V resin in styrene solution. (Hetron 520V, a product of Durez Division of Hooker Chemical Company, is an isophthalic type polyester containing vinyl toluene monomer.) The coated material was exposed to a Gates 420 U11B mercury lamp and the tack-free cure time determined. The data, shown in Table 6, illustrate the operation of the mixture in an unsaturated polyester system.

TABLE 6

Testing In Isophthalic Type[a] Resin

| Photoinitiator I | Tack-Free Cure Time, Min. | |
|---|---|---|
| | Photoinitiator I at 2% | 2% Photoinitiator I With NCS[b] at 2% |
| None | — | >3.0 |
| 4-Chloromethyl-4'-carbomethoxybenzophenone | 2.0 | 1.0 |
| 4,4'-Bis(α-chloracetyl)benzene | 3.7 | 2.0 |
| Benzophenone | 2.2 | 1.8 |

[a] Hetron 520B + 27.6% styrene
[b] N-chlorosuccinimide

EXAMPLE 7

The photoinitiators to be evaluated were added to the αβ-unsaturated composition of Example 5. Coatings (4 mils thick) were exposed in 0.1-minute increments to a Gates 420 U11B mercury lamp until a tack-free cure was effected. The tack-free cured films were then extracted with dichloromethane and the percent extractables determined.

The results, summarized in Table 7, indicate that 4,4'-dimethylbenzophenone is synergistic with both N-chlorosuccinimide and N-bromosuccinimide. The extraction data indicate that the synergistic mixtures cure to an equal or higher degree than do the individual components.

TABLE 7

Effectiveness of 4,4'-Dimethylbenzophenone Mixtures

| Concn. 4,4'-Dimethyl-benzophenone, % | 2nd Initiator | Concn. | Tack-Free Cure Time, Min. | % Extractable |
|---|---|---|---|---|
| 0 | NCS[a] | 1.75 | 3.2 | 10.1 |
| 1.0 | None | — | 3.2 | 11.5 |
| 1.0 | NCS | 1.75 | 2.0 | 4.2 |
| 0 | NBS[b] | 1.3 | 3.2 | 18.0 |
| 1.0 | NBS | 1.3 | 1.8 | 9.6 |

[a] N-chlorosuccinimide
[b] N-bromosuccinimide

EXAMPLE 8

The following photoinitiator mixtures were tested in a base composition consisting of:
13.3% cellulose propionate crotonate
60.0% hydroxypropyl acrylate
13.3% diethylene glycol diacrylate
6.7% neopentyl glycol diacrylate
6.7% benzyl acrylate The compositions listed in Table 8 were added to a prepared dope of the base composition. A 4 mil-thick film was applied to a glass plate with a doctor blade and the film was cured by irradiation in air with a Gates 420 U11B mercury lamp (80 watts/in.). The irradiation time required to cure the films to a tack-free state was determined.

The results, shown in Table 8, indicate that N-chloroacetanilide and N-chlorobenzanilide are effective when used in combination with 4,4'-bis(chloromethyl)-benzophenone. The solubility results shown in column 3 were determined by peeling the cured film from the glass plates and conducting solubility tests. Solubility of the composition in acetone indicates curing did not occur but rather the film was generated by evaporation of the monomers.

TABLE 8

Anilides Synergistic With 4,4'-Bis(chloromethyl)benzophenone

| Additive and Concn. in Base Composition | Tack-Free Cure, Min. | Acetone Solubility |
|---|---|---|
| None | 3.5 | Soluble |
| 1% N-chlorobenzanilide | 2.0 | Partially Soluble |
| 1% N-chloroacetanilide | 2.5 | Partially soluble |
| 1% N-chlorosuccinimide | 3.5 | Partially soluble |
| 1% 4,4'-Bis(chloromethyl)benzophenone 1% N-chlorobenzanilide | 2.0 | Insoluble |
| 1% 4,4'-Bis(chloromethyl)benzophenone 1% N-chloroacetanilide | 1.5 | Insoluble |
| 1% 4,4'-Bis(chloromethyl)benzophenone 1% N-chlorosuccinimide | 1.5 | Insoluble |
| 1% 4,4-Bis(chloromethyl)benzophenone | 2.0 | Insoluble |

The invention has been described in detail with particular reference to certain preferred embodiments thereof, but it will be understood that variations and modifications can be effected within the spirit and scope of the invention.

We claim:

1. A composition comprising an ethylenically unsaturated material susceptible to photopolymerization and a photoinitiating effective amount of a mixture comprising a primary photoinitiator and a halogen compound selected from N-chlorosuccinimide, N-bromosuccinimide, N-chloroacetanilide and N-chlorobenzanilide, the weight ratio of primary photoinitiator to halogen compound being about 1:20 to 10:1.

2. A composition according to claim 1 wherein the primary photoinitiator is selected from benzophenone, 1-chloromethylnaphthalene, 2-chlorothioxanthone, α,α-diethoxyacetophenone, 2,3-dichloronaphthoquinone, 4,4'-bis(α-chloroacetyl)benzene, α,α,α-trichloroacetophenone, isopropyl benzoin ether, 4'-tert-butyl-α,α,α-trichloroacetophenone, 4,4'-bis(chloromethyl)benzophenone, 4-chloromethyl-4'-carbomethoxybenzophenone, 2-chloromethylbenzimidazole, 2-(α-chlorotolyl)benzoxazole and 4,4'-dimethylbenzophenone.

3. A composition according to claim 1 wherein the concentration of the primary photoinitiator is from about 1-5 weight percent and the concentration of the halogen compound is about 1-10 weight percent, based on the weight of the composition.

4. A composition according to claim 3 wherein the primary photoinitiator is selected from benzophenone, 1-chloromethylnaphthalene, 2-chlorothioxanthone, α,α-diethoxyacetophenone, 2,3-dichloronaphthoquinone, 4,4'-bis(α-chloroacetyl)benzene, α,α,α-trichloroacetophenone, isopropyl benzoin ether, 4'-tert-butyl-α,α,α-trichloroacetophenone, 4,4'-bis(chloromethyl)benzophenone, 4-chloromethyl-4'-carbomethoxybenzophenone, 2-chloromethylbenzimidazole, 2-(α-chlorotolyl)benzoxazole and 4,4'-dimethylbenzophenone.

5. A composition comprising an ethylenically unsaturated material susceptible to photopolymerization and a photoinitiating effective amount of a mixture comprising a primary photoinitiator selected from benzophenone, 1-chloromethylnaphthalene, 2-chlorothioxanthone, α,α-diethoxyacetophenone, 2,3-dichloronaphthoquinone, 4,4'-bis(α-chloroacetyl)benzene, α,α,α-trichloroacetophenone, isopropyl benzoin ether, 4'-tert-butyl-α,α,α-trichloroacetophenone, 4,4'-bis(chloromethyl)benzophenone, 4-chloromethyl-4'-carbomethoxybenzophenone, 2-chloromethylbenzimidazole, 2-α-chlorotolyl)benzoxazole and 4,4'-dimethylbenzophenone and a halogen compound selected from N-chlorosuccinimide, N-bromosuccinimide, N-chloroacetanilide and N-chlorobenzanilide, wherein the concentration of the primary photoinitiator is from about 1-5 weight percent and the concentration of the halogen compound is about 1-10 weight percent, based on the weight of the composition.

* * * * *